(12) United States Patent
Cho et al.

(10) Patent No.: US 9,786,730 B2
(45) Date of Patent: Oct. 10, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventors: Young Jin Cho, Seoul (KR); Deok-Young Choi, Hwaseong-si (KR); Young-In Hwang, Suwon-si (KR); Chul Kyu Kang, Suwon-si (KR); Yong Jae Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/858,483

(22) Filed: Sep. 18, 2015

(65) Prior Publication Data

US 2016/0148988 A1 May 26, 2016

(30) Foreign Application Priority Data

Nov. 21, 2014 (KR) ........................ 10-2014-0163368

(51) Int. Cl.
*H01L 27/32* (2006.01)
*G09G 3/3233* (2016.01)

(52) U.S. Cl.
CPC ....... *H01L 27/3276* (2013.01); *G09G 3/3233* (2013.01); *H01L 27/3248* (2013.01); *H01L 27/3262* (2013.01); *G09G 2300/0861* (2013.01); *H01L 27/3211* (2013.01)

(58) Field of Classification Search
CPC . H01L 27/32; H01L 27/3262; H01L 27/3211; H01L 27/3276; G09G 3/3233
See application file for complete search history.

(56) References Cited

U.S. PATENT DOCUMENTS

| | | |
|---|---|---|
| 2006/0164345 A1 | 7/2006 | Sarma et al. |
| 2012/0019498 A1* | 1/2012 | Jeong .................... G09G 3/3233 345/211 |
| 2013/0271501 A1* | 10/2013 | Yang ..................... G09G 3/3233 345/690 |
| 2014/0291640 A1* | 10/2014 | Miyake ............... H01L 27/3262 257/40 |

FOREIGN PATENT DOCUMENTS

| | | |
|---|---|---|
| KR | 10-0784013 B1 | 12/2007 |
| KR | 10-2008-0054050 A | 6/2008 |
| KR | 10-2011-0103735 A | 9/2011 |

* cited by examiner

*Primary Examiner* — Phuc Dang
(74) *Attorney, Agent, or Firm* — Lewis Roca Rothgerber Christie LLP

(57) ABSTRACT

An organic light emitting device includes: a first transistor including a source electrode connected to a data line and a gate electrode connected to a scan line; a second transistor including a source electrode connected to a driving voltage and a gate electrode connected to a drain electrode of the first transistor; a capacitor connected between the gate electrode of the second transistor and the source electrode of the second transistor; an organic light emitting diode connected to a drain electrode of the second transistor; and a third transistor connected to the organic light emitting diode and a common voltage.

9 Claims, 8 Drawing Sheets

ORGANIC LIGHT EMITTING DIODE DISPLAY

CROSS-REFERENCE TO RELATED APPLICATION

This application claims priority to and the benefit of Korean Patent Application No. 10-2014-0163368 filed in the Korean Intellectual Property Office on Nov. 21, 2014, the entire contents of which are incorporated herein by reference.

BACKGROUND OF THE INVENTION

1. Field

The present invention relates to an organic light emitting device.

2. Description of the Related Art

A basic configuration of a pixel circuit of an organic light emitting device (OLED) includes two transistors and one capacitor. Generally, the organic light emitting device is configured with a cathode and a node having a common voltage or a common power voltage (ELVSS), so there is a limit to configuration and operation of the circuit.

The driving voltage (ELVDD) is generally set to be a low voltage in the beginning, and a drain electrode of a driving transistor is initialized with the low voltage of the driving voltage. The organic light emitting device is turned off by applying a reverse bias with a high voltage of the common power voltage. In this instance, a coupling error may be generated by parasitic capacitance (Cap) because of power swinging.

The pixel circuit generally includes an additional wire for supplying another voltage (Vinit) when an anode is reset after emission of light.

The above information disclosed in this Background section is only for enhancement of understanding of the background of the invention and therefore it may contain information that does not form prior art.

SUMMARY

One or more embodiments of the present invention relate to an organic light emitting device having a circuit with various configurations.

An exemplary embodiment of the present invention provides an organic light emitting device including: a first transistor including a source electrode connected to a data line and a gate electrode connected to a scan line; a second transistor including a source electrode connected to a driving voltage and a gate electrode connected to a drain electrode of the first transistor; a capacitor connected between the gate electrode of the second transistor and the source electrode of the second transistor; an organic light emitting diode connected to a drain electrode of the second transistor; and a third transistor connected to the organic light emitting diode and a common voltage.

The third transistor may be between a cathode of the organic light emitting diode and the common voltage.

The third transistor may include a drain electrode connected to the cathode of the organic light emitting diode and a source electrode connected to the common voltage.

The source electrode of the third transistor may be connected to the cathode of the organic light emitting diode, and a first resistance component of the common voltage and a second resistance component of the cathode may form double wires in parallel.

The third transistor may be formed for respective subpixels configured to emit red, green, and blue light, or a pixel including red, green, and blue.

Another exemplary embodiment of the present invention provides an organic light emitting device including: a first transistor including a source electrode connected to a data line and a gate electrode connected to a scan line; a second transistor including a source electrode connected to a driving voltage and a gate electrode connected to a drain electrode of the first transistor; an organic light emitting diode connected to a drain electrode of the second transistor; and a third transistor connected between a cathode and an anode of the organic light emitting diode.

The third transistor may include a drain electrode connected to the anode of the organic light emitting diode, and a source electrode connected to at least one of the cathode of the organic light emitting diode and a common voltage.

The third transistor may be configured to reset the anode of the organic light emitting diode by utilizing the common voltage.

The third transistor may be configured to control driving of the organic light emitting diode for respective subpixels configured to emit red, green, and blue light, or to control driving of the organic light emitting diode for each pixel including red, green, and blue.

Another exemplary embodiment of the present invention provides an organic light emitting device including: a substrate; an active layer on the substrate; a gate insulating layer on the active layer; a gate electrode corresponding to the active layer on the gate insulating layer; a first electrode on the gate insulating layer and connected to an organic light emitting diode; and a second electrode on the gate insulating layer and connected to a common voltage.

The first electrode may be connected to a cathode of the organic light emitting diode.

The second electrode may be connected to at least one of a cathode of the organic light emitting diode and the common voltage.

The first electrode may form a drain electrode of a third transistor, and the second electrode may form a source electrode of the third transistor.

The first electrode may be connected to an anode of the organic light emitting diode, and the second electrode may be connected to a cathode of the organic light emitting diode or a common electrode to form a third transistor.

The third transistor may be configured to reset the anode of the organic light emitting diode by utilizing the common voltage connected to the second electrode.

According to the embodiments of the present invention, the pixel circuit with various configurations is formed, and the wires for resetting the anode are reduced to acquire the aperture ratio or form a configuration that is robust for stabilization of power.

DETAILED DESCRIPTION

Figure 1:
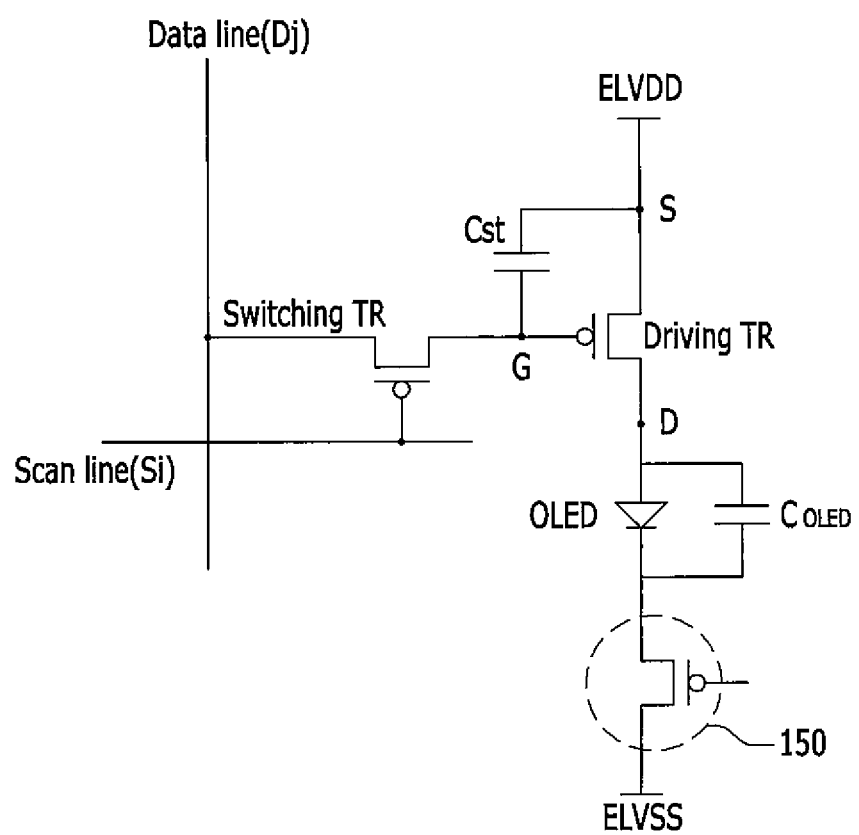
FIG. 1 shows of an equivalent circuit diagram of a subpixel of an organic light emitting device according to a first exemplary embodiment of the present invention.

In the following detailed description, certain exemplary embodiments of the present invention have been shown and described, simply by way of illustration. As those skilled in the art would realize, the described embodiments may be modified in various different ways, all without departing from the spirit and scope of the present invention. Accordingly, the drawings and description are to be regarded as illustrative in nature and not restrictive. Like reference numerals designate like elements throughout the specification.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

An organic light emitting device according to exemplary embodiments of the present invention will now be described with reference to the accompanying drawings.

FIG. 1 shows of an equivalent circuit diagram of a subpixel of an organic light emitting device according to a first exemplary embodiment of the present invention.

The subpixel shown in FIG. 1 is connected to an i-th scan line (Si) and a j-th data line (Dj).

As shown in FIG. 1, the subpixel includes a switching transistor (Switching TR), a driving transistor (Driving TR), a first capacitor (Cst), and an organic light emitting diode (OLED).

The switching transistor includes a gate electrode connected to the scan line Si, an electrode connected to a data line Dj, and another electrode connected to a gate electrode of the driving transistor.

The driving transistor includes a source electrode connected to a driving voltage (ELVDD), a drain electrode connected to an anode of an organic light emitting diode OLED, and a gate electrode connected to the switching transistor.

The first capacitor Cst is connected between the gate electrode and the source electrode of the driving transistor, and a cathode of the organic light emitting diode (OLED) is connected to the common voltage (ELVSS).

When a scan signal transmitted through the scan line Si is a low level, the switching transistor is turned on, and the first capacitor Cst is charged by a data signal transmitted through the data line Dj.

The gate voltage of the driving transistor is maintained or substantially maintained by the first capacitor Cst until a next scan period, and a driving current is generated by a gate-source voltage difference of the driving transistor. The organic light emitting diode (OLED) emits light according to the driving current.

The organic light emitting device according to the first exemplary embodiment of the present invention includes a third transistor 150 formed between the cathode of the organic light emitting diode (OLED) and the common voltage (ELVSS).

The third transistor 150 includes a drain electrode connected to the cathode of the organic light emitting diode, and a source electrode connected to the common voltage. A first resistance component of the common voltage and a second resistance component of the cathode may form double wires in parallel.

Figure 2:
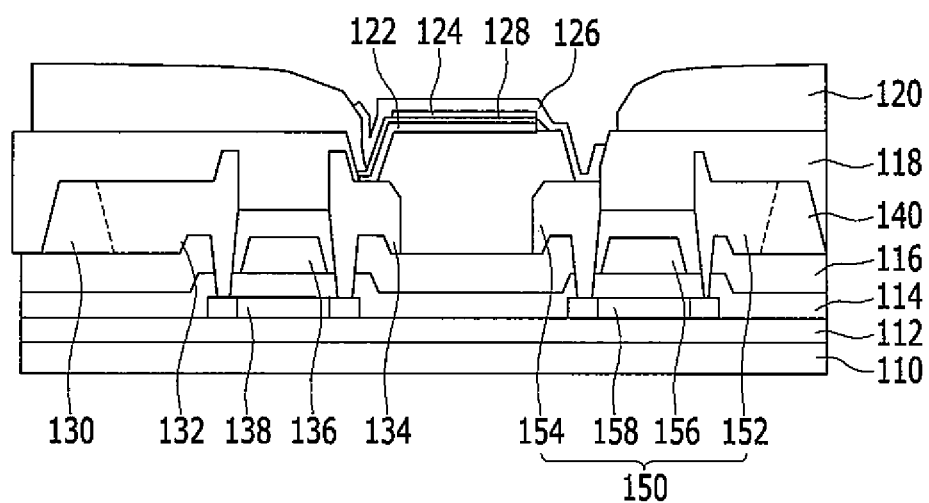
FIG. 2 shows a cross-sectional view of an organic light emitting device according to the first exemplary embodiment of the present invention.

FIG. 2 shows a cross-sectional view of an organic light emitting device according to a first exemplary embodiment of the present invention.

Referring to FIG. 2, the organic light emitting device according to a first exemplary embodiment of the present invention includes a buffer 112, a gate insulating layer 114, an interlayer insulating layer (ILD) 116, a VIA 118, and a pixel defining layer (PDL) 120 formed on a substrate 110.

A source electrode 132, a drain electrode 134, a gate electrode 136, and an active layer 138 form the driving transistor. An emission layer 124, an EL common layer 128, an anode 122, and a cathode 126 form a pixel. The source electrode 132 of the driving transistor may be connected to a wire 130 for transmitting the driving voltage.

The organic light emitting device according to a first exemplary embodiment of the present invention further includes the third transistor 150 including a source electrode 152, a drain electrode 154, a gate electrode 156, and an active layer 158.

The cathode 126 of the organic light emitting diode is connected to the drain electrode 154 of the third transistor 150, and the source electrode 152 is connected to a wire 140 for transmitting the common voltage.

In summary, as shown in FIG. 1 and FIG. 2, the cathode of the organic light emitting diode is connected to the drain electrode 154 that is in the drain region of the third transistor 150. The source electrode 152 that is in the source region of the third transistor 150 is connected to the wire 140 for transmitting the common voltage. Here, an auxiliary wire of the common voltage (ELVSS) may be supplied from a power voltage supplying region of the panel.

As described, the organic light emitting device according to a first exemplary embodiment of the present invention may include an additional transistor between the cathode of the organic light emitting diode and the common voltage (ELVSS) in a configuration in which the EL common layer 128 is not deposited on the entire region.

Figure 3:
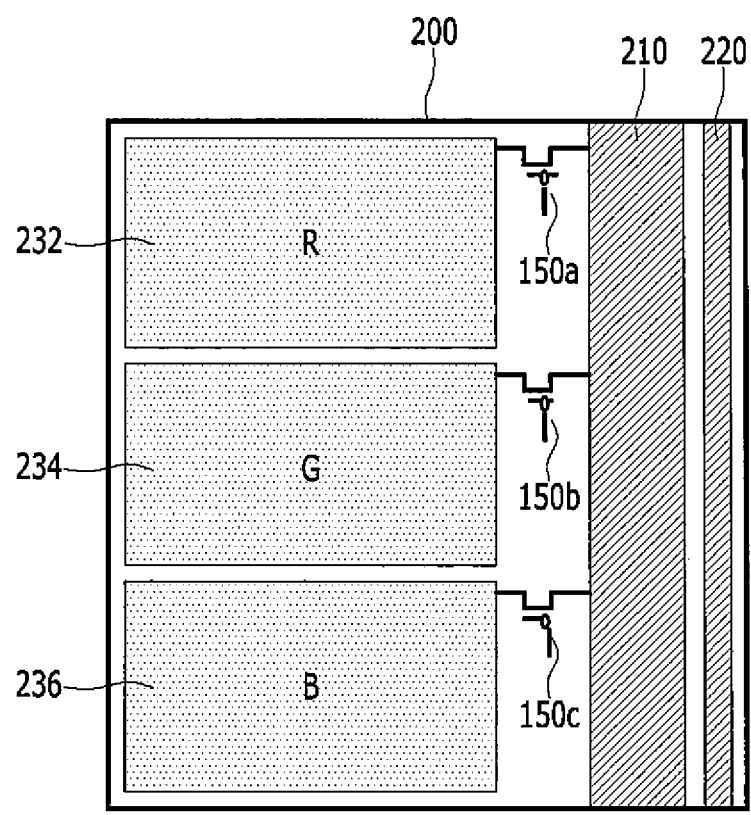
FIG. 3 shows a top plan view of a pixel of an organic light emitting device according to the first exemplary embodiment of the present invention.
Figure 4:
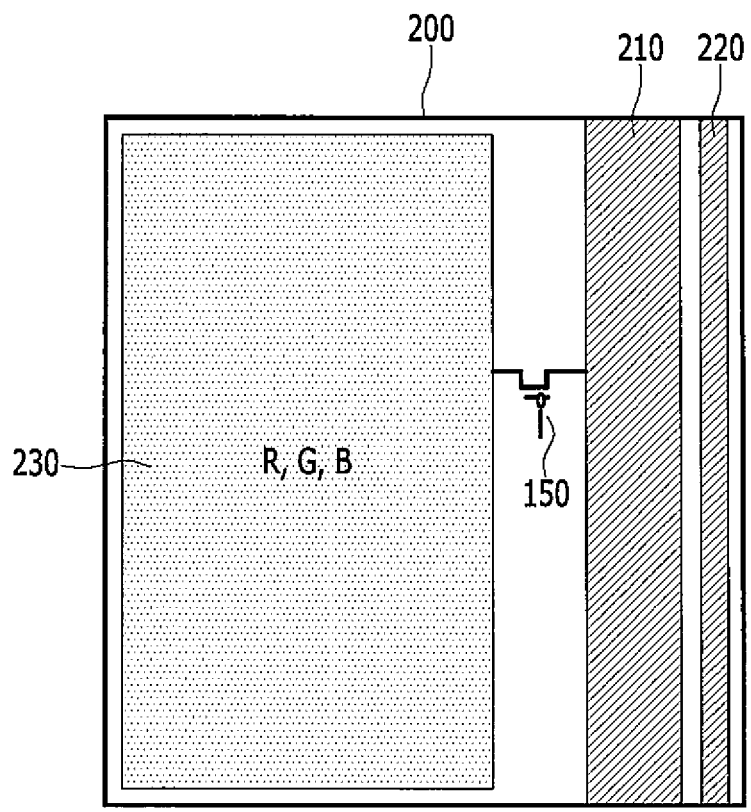
FIG. 4 shows a top plan view of a pixel of an organic light emitting device according to a second exemplary embodiment of the present invention.

FIG. 3 shows a top plan view of a pixel of an organic light emitting device according to the first exemplary embodiment of the present invention, and FIG. 4 shows a top plan view of a pixel of an organic light emitting device according to a second exemplary embodiment of the present invention.

Referring to FIG. 3, the organic light emitting device according to the first exemplary embodiment of the present invention includes third transistors 150a, 150b, and 150c and red (R), green (G), and blue (B) subpixels for respectively emitting red, green, and blue colored lights in a pixel region 200. As shown in FIG. 3, the third transistors 150a, 150b, and 150c respectively connect separately formed cathodes 232, 234, and 236 of the R, G, and B subpixels to an auxiliary wire 210 for transmitting the common voltage (ELVSS) in the pixel region 200. A data line 220 for transmitting the data signal is formed to be parallel or substantially parallel to the auxiliary wire 210.

As shown in FIG. 4, the organic light emitting device according to the second exemplary embodiment of the present invention may connect a commonly formed cathode 230 of R, G, and B subpixels to the auxiliary wire 210 with a single third transistor 150.

The organic light emitting device according to the first exemplary embodiment of the present invention may control the respective R, G, and B subpixels through the signals supplied to the gate electrodes of the third transistors 150a, 150b, and 150c, respectively. The organic light emitting device according to the second exemplary embodiment of the present invention may control driving of the organic light emitting diode for the respective pixels including R, G, and B subpixels through the signal supplied to the gate electrode of the single third transistor 150, and various other driving methods may be possible.

Figure 5:
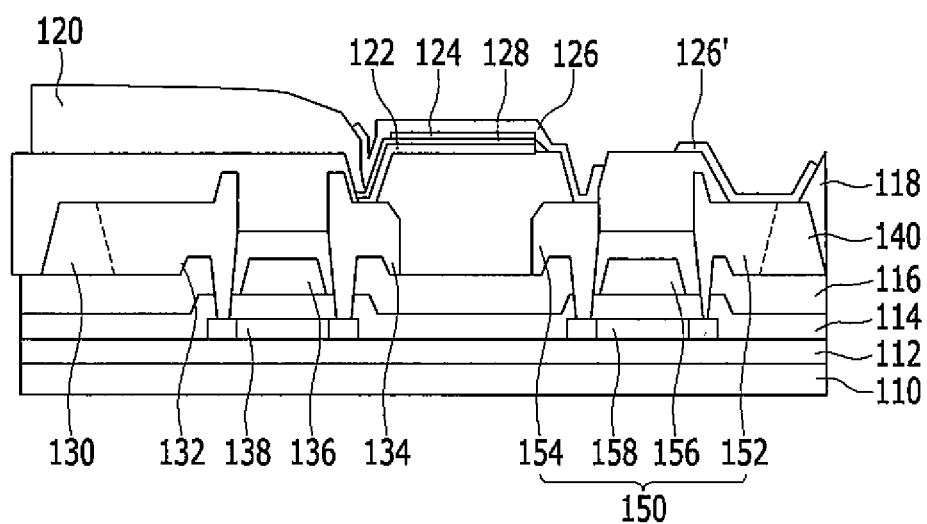
FIG. 5 shows a cross-sectional view of an organic light emitting device according to a third exemplary embodiment of the present invention.
Figure 6:
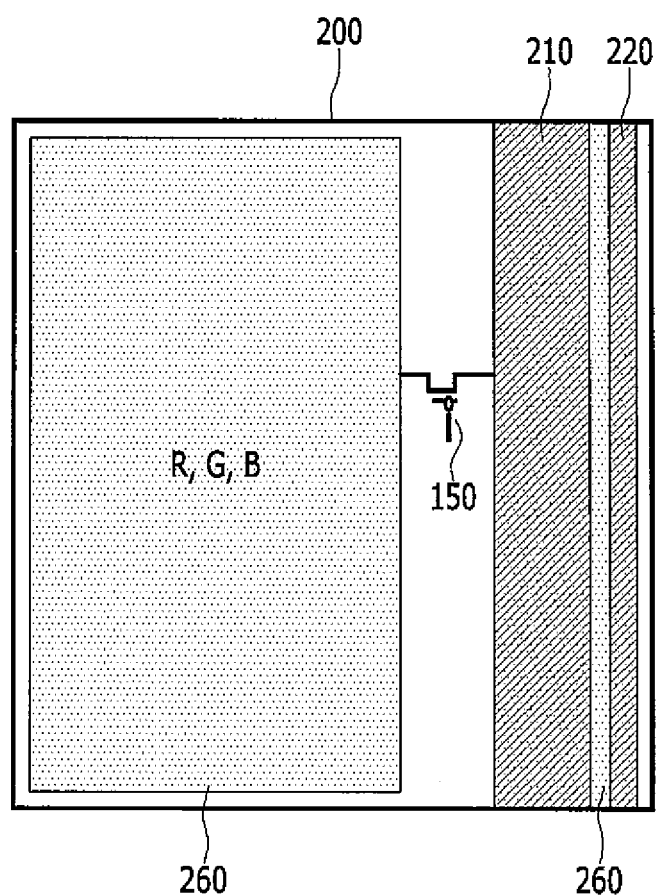
FIG. 6 shows a top plan view of a pixel of an organic light emitting device according to the third exemplary embodiment of the present invention.

FIG. 5 shows a cross-sectional view of an organic light emitting device according to a third exemplary embodiment of the present invention, and FIG. 6 shows a top plan view of a pixel of an organic light emitting device according to the third exemplary embodiment of the present invention.

Referring to FIG. 5, the organic light emitting device according to the third exemplary embodiment of the present invention includes a via hole through which the second electrode 152 that is the source electrode of the third transistor 150 may be connected to a separated portion 126' of the cathode 126 of the organic light emitting diode.

The second electrode 152 that is the source electrode of the third transistor 150 and the separated portion 126' of the cathode 126 of the organic light emitting diode are connected to the wire 140 for transmitting the common voltage (ELVSS).

Therefore, the organic light emitting device according to the third exemplary embodiment of the present invention may form double wires by connecting a first resistance component (Relvss) of the wire 140 of the common voltage and a second resistance component (Rcathode) of the separated portion 126' of the cathode 126 in parallel.

As shown in FIG. 5 and FIG. 6, in the organic light emitting device according to the third exemplary embodiment of the present invention, the separated portion 126' of the cathode 126 may contact the second electrode 152 of the third transistor 150 through an opening of a VIA 118 and a PDL 120 on a common voltage auxiliary wire 210 of the ELVSS corresponding to the wire 140 of the common voltage. Double wires may be formed by using an FMM configuration or a configuration contacting the separated portion of the cathode and the common voltage so as to reduce a voltage drop (IR Drop) caused by cathode patterning. Entire resistance is reduced and the voltage drop (IR Drop) is reduced when the double wires are used with a second resistance component ($R_{cathode}$) of the separated portion 126' of the cathode 126, compared to a case in which there is only a first resistance component ($R_{elvss}$) of the wire 140 of the common voltage.

For example, as shown in FIG. 6, the line 210 corresponds to the wire 140 of the common voltage shown in FIG. 5, which is connected to the source electrode 152 of the transistor 150 and the separated portion 126' of the cathode 126. The cathodes of the R, G, and B, subpixels are connected to the line 210 through a single third transistor 150. Further, a material 260 for forming the cathodes of the R, G, and B subpixels may be formed to overlap the line 210 and the data line 220.

Figure 7:
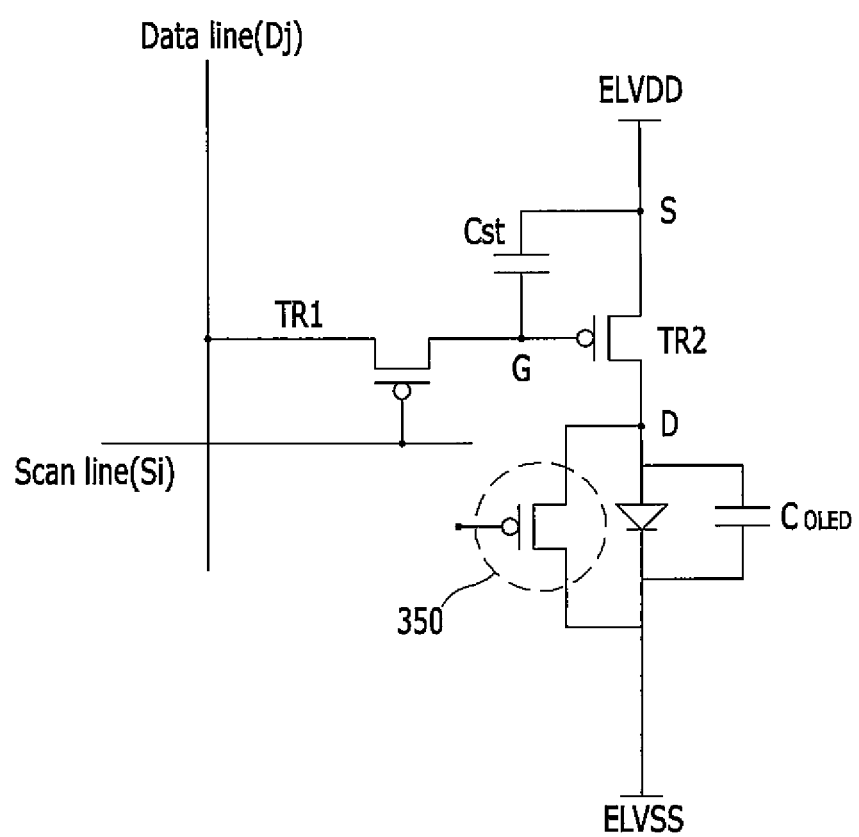
FIG. 7 shows an equivalent circuit diagram of a subpixel of an organic light emitting device according to a fourth exemplary embodiment of the present invention.
Figure 8:
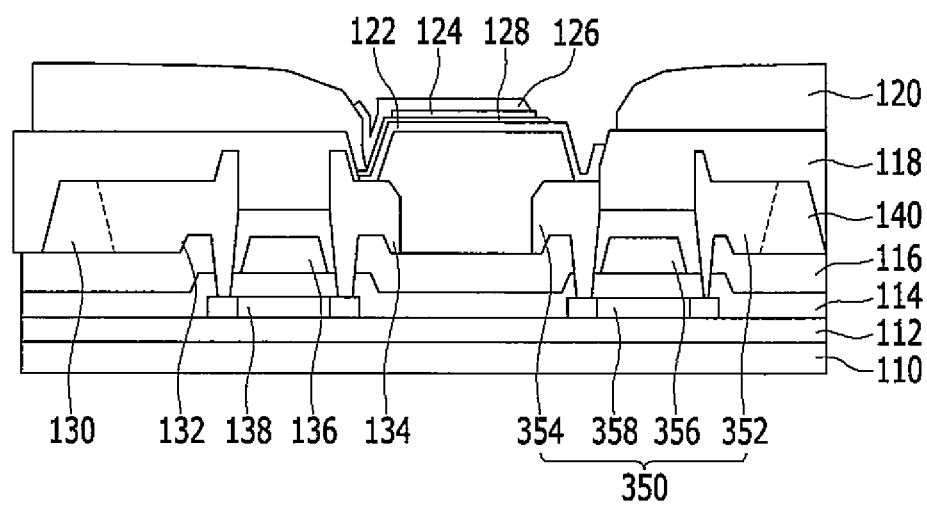
FIG. 8 shows a cross-sectional view of an organic light emitting device according to the fourth exemplary embodiment of the present invention.

FIG. 7 shows an equivalent circuit diagram of a subpixel of an organic light emitting device according to a fourth exemplary embodiment of the present invention, and FIG. 8 shows a cross-sectional view of an organic light emitting device according to the fourth exemplary embodiment of the present invention.

Referring to FIG. 7 and FIG. 8, an organic light emitting device according to the fourth exemplary embodiment of the present invention may include a third transistor 350 between the anode and the cathode of the organic light emitting diode or between the anode of the organic light emitting diode and the common voltage (ELVSS).

As shown in FIG. 8, the organic light emitting device according to the fourth exemplary embodiment of the present invention connects the anode 122 of the organic light emitting diode to a first electrode 354 that is the drain electrode of the third transistor 350. A second electrode 352 that is the source electrode of the third transistor 350 is connected to the wire 140 for transmitting the common voltage. Here, the second electrode 352 of the third transistor 350 may be connected to the cathode 126 of the organic light emitting diode through the wire 140 for transmitting the common voltage.

As described, the organic light emitting device according to the fourth exemplary embodiment of the present invention may reset the anode 122 of the organic light emitting diode by using the wire 140 for transmitting the common voltage connected to the second electrode 352 that is the source electrode of the third transistor 350.

An existing pixel circuit configuration uses an additional wire for providing an additional voltage (Vinit) when the anode is reset after emission of light. Further, the existing pixel circuit resets the anode by swinging simultaneous emission with an active voltage (SEAV) based common voltage (ELVSS) and the driving voltage (ELVDD) power.

However, according to the organic light emitting device according to an exemplary embodiment of the present invention, when the third transistor 350 is turned on, the anode may be reset with the common power voltage (ELVSS) to reduce power supply wires compared to that of the existing pixel circuit, and may ease acquisition of the aperture ratio. Further, the organic light emitting device according to an exemplary embodiment of the present invention does not use swinging of the power voltage compared to the SEAV method, thereby allowing formation of a mura-free structure that is less influenced by the coupling or providing a very robust configuration while stabilizing the power.

As described, the organic light emitting device according to an exemplary embodiment of the present invention forms an additional transistor between the cathode and the common voltage (ELVSS) to further efficiently use the OLED cap (COLED) and may form various configurations of the pixel circuit.

Also, the organic light emitting device according to an exemplary embodiment of the present invention reduces the wires for resetting the anode to acquire the aperture ratio and increases the lifespan, or prevents or substantially prevents swinging of the power and allows less influence of coupling.

The organic light emitting device according to an exemplary embodiment of the present invention turns off the transistor between the cathode and the common voltage, and controls the timing to minimize the coupling when the power is swung.

The various electric or electronic devices or components according to embodiments of the present invention described above may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present invention.

While this invention has been described in connection with what is presently considered to be practical exemplary embodiments, it is to be understood that the invention is not limited to the disclosed embodiments, and is intended to cover various modifications and equivalent arrangements included within the spirit and scope of the appended claims, and their equivalents.

What is claimed is:

1. An organic light emitting device comprising:
a first transistor comprising a source electrode connected to a data line and a gate electrode connected to a scan line;
a second transistor comprising a source electrode connected to a driving voltage and a gate electrode connected to a drain electrode of the first transistor;
a capacitor connected between the gate electrode of the second transistor and the source electrode of the second transistor;
an organic light emitting diode connected to a drain electrode of the second transistor; and
a third transistor connected between the organic light emitting diode and a common voltage.

2. The organic light emitting device of claim 1, wherein the third transistor is between a cathode of the organic light emitting diode and the common voltage.

3. The organic light emitting device of claim 2, wherein the third transistor comprises a source electrode connected to the cathode of the organic light emitting diode and a drain electrode connected to the common voltage.

4. The organic light emitting device of claim 2, wherein the third transistor is formed for respective subpixels configured to emit red, green, and blue light, or a pixel comprising red, green, and blue.

5. An organic light emitting device comprising:
a first transistor comprising a source electrode connected to a data line and a gate electrode connected to a scan line;

a second transistor comprising a source electrode connected to a driving voltage and a gate electrode connected to a drain electrode of the first transistor;

a capacitor connected between the gate electrode of the second transistor and the source electrode of the second transistor;

an organic light emitting diode connected to a drain electrode of the second transistor; and a third transistor connected to the organic light emitting diode and a common voltage, wherein a source electrode of the third transistor is connected to a cathode of the organic light emitting diode, and a first resistance component of the common voltage and a second resistance component of the cathode form double wires in parallel.

6. An organic light emitting device comprising:

a first transistor comprising a source electrode connected to a data line and a gate electrode connected to a scan line;

a second transistor comprising a source electrode connected to a driving voltage and a gate electrode connected to a drain electrode of the first transistor;

an organic light emitting diode connected to a drain electrode of the second transistor; and a third transistor connected between a cathode and an anode of the organic light emitting diode, wherein the third transistor is configured to reset the organic light emitting diode after emission of light by utilizing a common voltage.

7. The organic light emitting device of claim 6, wherein the third transistor comprises a drain electrode connected to the anode of the organic light emitting diode, and a source electrode connected to at least one of the cathode of the organic light emitting diode and the common voltage.

8. The organic light emitting device of claim 7, wherein the third transistor is configured to reset the anode of the organic light emitting diode by utilizing the common voltage.

9. The organic light emitting device of claim 8, wherein the third transistor is configured to control driving of the organic light emitting diode for respective subpixels configured to emit red, green, and blue light, or to control driving of the organic light emitting diode for each pixel including red, green, and blue.

* * * * *